United States Patent

Asanasavest

[11] Patent Number: 5,230,458
[45] Date of Patent: Jul. 27, 1993

[54] INTERCONNECT FORMATION UTILIZING REAL-TIME FEEDBACK

[75] Inventor: Chainarong Asanasavest, Penang, Malaysia

[73] Assignee: National Semiconductor Corp., Santa Clara, Calif.

[21] Appl. No.: 902,944

[22] Filed: Jun. 23, 1992

[51] Int. Cl.$^5$ .................................. H01L 21/607
[52] U.S. Cl. ........................... 228/102; 228/179; 228/4.5; 228/9
[58] Field of Search .............. 228/102, 110, 179, 1.1, 228/4.5, 8, 9, 56.5

[56] References Cited

U.S. PATENT DOCUMENTS

| | | | |
|---|---|---|---|
| 3,727,822 | 4/1973 | Umbaugh | 228/1.1 |
| 4,438,880 | 3/1984 | Smith et al. | 228/110 |
| 4,653,681 | 3/1987 | Dreibelbis et al. | 228/102 |
| 4,789,095 | 12/1988 | Kobayashi | 228/102 |
| 4,806,193 | 2/1989 | Von Raben et al. | 228/104 |
| 4,814,848 | 4/1989 | Gabaldon | 228/102 |
| 4,854,494 | 8/1989 | von Raben | 228/102 |
| 5,060,841 | 10/1991 | Oshima et al. | 228/102 |

Primary Examiner—Samuel M. Heinrich
Attorney, Agent, or Firm—Steven F. Caserza

[57] ABSTRACT

The present invention provides real time feedback interconnect system which allows real-time detection and control of bond force exerted on the bond site. A force sensor is provided in the bond system, which detects the bond force exerted by the bond tool. The force sensor provides a force signal to a real-time feedback circuit. The feedback circuit transmits a force adjustment signal to a z-motion actuator to adjust the force applied to the bond site.

7 Claims, 9 Drawing Sheets

INTERCONNECT FORMATION UTILIZING REAL-TIME FEEDBACK

TECHNICAL FIELD

The present invention relates to chip interconnection and bonding systems, such as wirebonders, which form electrical connections between an integrated circuit and a microcircuit package or substrate.

BACKGROUND

An integrated circuit, otherwise known as a "chip" or a "die," is typically supported and protected by a microcircuit package. Electrical input and output signals and power to the chip are available through metallic, electrically conductive areas known as the bond pads located around a perimeter of the die. For access to the chip circuitry, proper electrical interconnections are required between these bond pads and a plurality of metallic connector leads on a lead frame of the microcircuit package to ensure accurate signal communication between the chip and external circuits. Various types of microcircuit packages are known, such as single in-line package (SIP), dual in-line package (DIP), pin grid array (PGA), quad flat package (QFP), and leadles chip carrier (LCC). In these examples, the lead frame is housed in a ceramic or a plastic package prior to electrical coupling of the package to a printed circuit board. However, other microcircuit packages may have the chip directly coupled to the printed circuit board or mounted on a substrate, typically along with other chips, which is then coupled to the printed circuit board to affectuate the electrical coupling of the chip to the printed circuit board. The process of forming the electrical interconnections between the bond pads and the leads of the microcircuit package is more commonly known as "chip-connection," or "chip interconnect," with the most commonly used chip interconnect technology in the microelectronics industry being wirebonding.

FIG. 1 shows one example of forming chip interconnections by wirebonding. Typically, after die 10 is bonded to micrcocircuit package 50 (for example, with die-bonding epoxies), a wirebonder is then used to form bonds 35-36 to couple electrically conductive wire 40 between bond pad 20 and connector lead 30. Since bonds 35-36 form an essential signal path for transmitting and receiving electrical signals between die 10 and connector lead 30, it is essential that the wirebonder used to form these bonds produces high quality and accurate bonds to ensure proper function and signal communication between chip 10 and other external circuits, and also to ensure long term reliable operation of chip 10.

Several wirebonding techniques are known in forming metallic bonds 35-36. The three most common wirebonding techniques are ultrasonic (U/S) bonding, thermocompression (T/C) bonding, and thermosonic (T/S) bonding. Prior art wirebonders typically incorporate one of these known techniques in the formation of bonds 35-36. For example, in U/S bonding, the wirebonder guides wire 40 to a bonding site, such as bond pad 20, and then wire 40 is pressed onto the bond site by bond tool 60 (See FIGS. 2a-2c), such as a capillary. While capillary 60 presses wire 40 to the bond site, a burst of ultrasonic energy is applied to capillary 60. The combination of the pressure and the vibration of capillary 60 against metallic wire 40 and the metallic surface of the bond site results in the formation of a metallurgical cold weld between wire 40 and the bond site.

In thermocompression bonding, or T/C bonding, the bond surface of capillary 60 is heated typically to 300°-400° C. as the capillary is pressed against a bond site. As shown in FIG. 2b, a ball 42 is formed by Electronic Flame Off (EFO) device 45 prior to bonding. The elevated temperature of capillary 60 causes the metal at the bond site to deform easily under the pressure applied by capillary 60, thus facilitating the formation of a metallic bond.

FIGS. 2a-2c illustrate thermosonic bonding, or T/S bonding, whereby the principles of U/S bonding and T/C bonding are combined. In T/S bonding, ultrasonic power 45 is apply to capillary 60 to augment the formation of metallic bond 35 as capillary 60 is held against the bond site. The application of ultrasonic power 45 to capillary 60 allows bonding to be accomplished at a lower bond surface temperature than is required in T/C bonding.

Regardless of which wirebonding technique is implemented in forming bonds 35-36, a common problem of prior art wirebonders is the inability to accurately and quickly detect the amount of bond force being applied by the bond tool to the bond surface. Prior art wirebonders typically use mechanical indirect sensing means to sense when the capillary touches the bond pad, and to sense the bond force applied.

FIG. 3a is an example of a prior art wirebonder. In wirebonder 65, bond tool 60, such as a capillary, is attached to transducer 80. Typically, bond wire 40 is threaded through capillary 60 as a convenient way to supply bond wire 40 to wirebonder 65. Transducer support frame 71 is coupled to transducer 80 to allow a joined rigid controlled movement of transducer 80 together with support frame 71. Support frame 71 also allows movement separate to transducer 80. Connecting rod 74 couples support frame 71 to motor crank 72, while motor crank 72 is coupled to a z-motion actuator (not shown), such as a z-motor. As connecting rod 74 moves vertically, bond force spring 73 attached to support frame 71 applies an associated force against transducer 80 to move capillary 60 towards and against bond site 160, thereby applying bond force to bond wire 40 and bond site 160.

Alternatively, a voice coil is used for providing vertical movement directly to the transducer, without the need for spring 73, as is know, for example, in the K & S 1484 machine.

Contact sensor 78 is provided to detect when capillary 60 first contacts bond site 160. Contact sensor 78 is also coupled to a central processing unit (CPU), not shown, of wirebonder 65 to provide a signal indicating to the CPU when contact is detected between capillary 60 and bond site 160. Once contact is detected, the CPU then directs motor crank 72 to move connecting rod 74 vertically one or more motor increments until the vertical distance travelled by connecting rod 74 corresponds to a predetermined vertical distance value stored in the CPU. The bond force value applied by capillary 60 on bond site 160 is thus approximately calculated from the vertical distance travelled by connecting rod 74. Therefore, the subsequent distance travelled by connecting rod 74 following contact of capillary 60 with bond site 160 roughly corresponds to the application of a predetermined bond force by capillary 60 on bond site 160. Damper solenoid 102 is provided to adjust the damping associated with movements of transducer 80 and capillary 60 on bond site 160.

FIG. 3b shows a simplified representation illustrating how the dynamic bond force on bond site 160 can be determined. Referring to FIG. 3b, bond force $f_b$ may be expressed as $$f_b = f(0) + f(x); \text{ where} \tag{1}$$

$f(x) = Kx$, with K equivalent to the spring constant, and x equivalent to the distance travelled by the spring; and $f(0)$ = the initial force required to cause deflection of the spring (for example, 35 grams).

FIG. 3c illustrates a typical dynamic bond force response of the force exerted by capillary 60 on bond site 160. On initial impact of capillary 60 with bond site 160, undesirable oscillation occurs which may cause damage such as cratering or puncturing of a bond pad. It is therefore desirable to minimize or eliminate the initial oscillation caused by capillary 60 on bond site 160 upon impact.

In another prior art wirebonder, the K&S 1484 manufactured by Kulicke and Soffa of Willow Grove, Pa., a motor provides the direct drive of the bond tool as it is lowered vertically, i.e. along a z-axis, down to the bond pad. A current sensor senses the motor current which is applied to the driving device, and compares the sensed current with an acceptable predefined current value. A sensed current which is greater than the predefined value indicates that the capillary has either made contact with the bond pad, or the capillary is exerting bond force against the bond pad. An increased sensed current corresponds to an increased bond force being applied to the bond pad. Thus, the K&S 1484 wirebonder indirectly and approximately detects the bond force by evaluating the applied motor current.

Prior art wirebonders provide an indirect means of determining bond force which results in inaccurate and slow detection and response time to excessive bond force being applied to the bond pad. Excessive bond force which is not timely sensed and remedied by the wirebonder often results in "cratering", a deformation of the chip's bond pad. Excessive force of the bond tool on the bond pad may also deform the silicon layers beneath the pad. Cratering results not just in bond pad deformation, but it may also seriously damage chip circuitry and operation. Other problems may also result from exerting excessive bond force on the die, such as puncturing the die to create a void, thus resulting in an ineffectually formed bond which is susceptible to unbonding, or decoupling of the bond wire to bond pad.

Therefore, there is a need for a wirebonder that provides real-time feedback sensing and controlling of the bond force exerted on the bond pad, without detracting from the quality and reliability of the electrical connection produced.

Relevant Literature

*Microelectronics Packaging Handbook*, pp. 15, 391–395 (R. Tummala & E. Rymaszewski ed. 1989).

SUMMARY OF THE INVENTION

The present invention teaches a real-time feedback interconnect wirebonder which allows real-time detection and control of bond force exerted on the bond site. A bond force sensor is provided in the bond head of the wirebonder, which directly detects in real time the bond force exerted by the bond tool on the bond site. A signal associated with the bond site force is transmitted to a real-time feedback control circuit. The real-time feedback control circuit is coupled to adjust the current provided to a damper in response to the force detected signal to increase or decrease the bond force applied to the bond site. In an alternative embodiment, the real-time feedback control circuit is coupled directly to a z motion actuator, such as a z-motor or a voice coil control, to adjust the bond force being exerted by the bond tool on the bond site.

BRIEF DESCRIPTION OF THE DRAWINGS

FIG. 4b is a simplified illustration of the bonder shown in FIG. 4a;

FIG. 5b is a timing diagram of the operation of the real-time feedback force sense circuit of FIG. 6a.

DESCRIPTION OF SPECIFIC EMBODIMENTS

Figure 1:
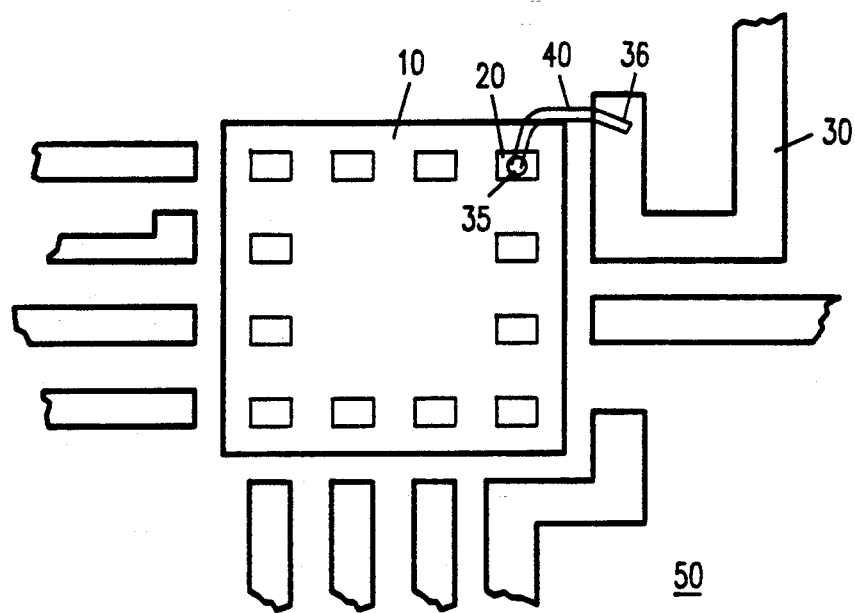
FIG. 1 illustrates an example of prior art wirebonding.
Figure 2A:
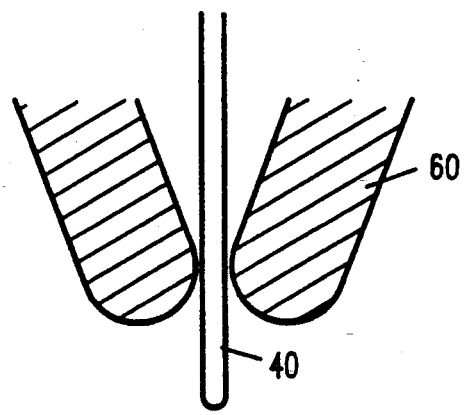
FIGS. 2a–2c illustrate one example of a prior art wirebonding technique.
Figure 2B:
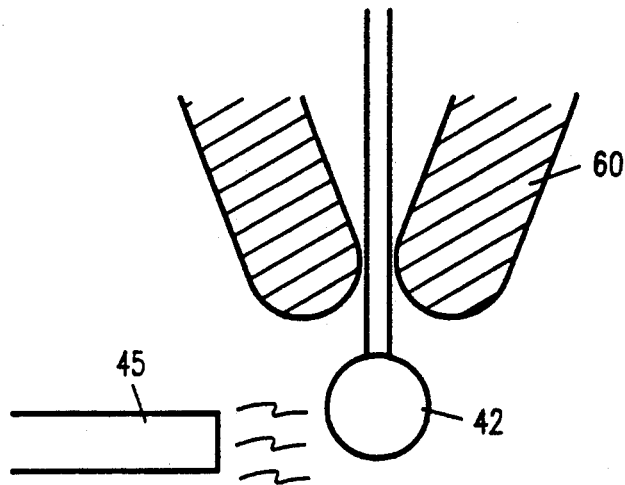
Figure 2C:
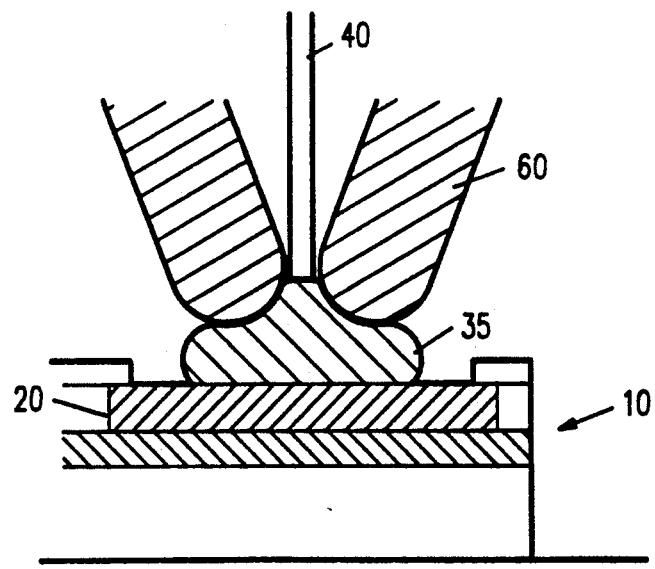
Figure 3A:
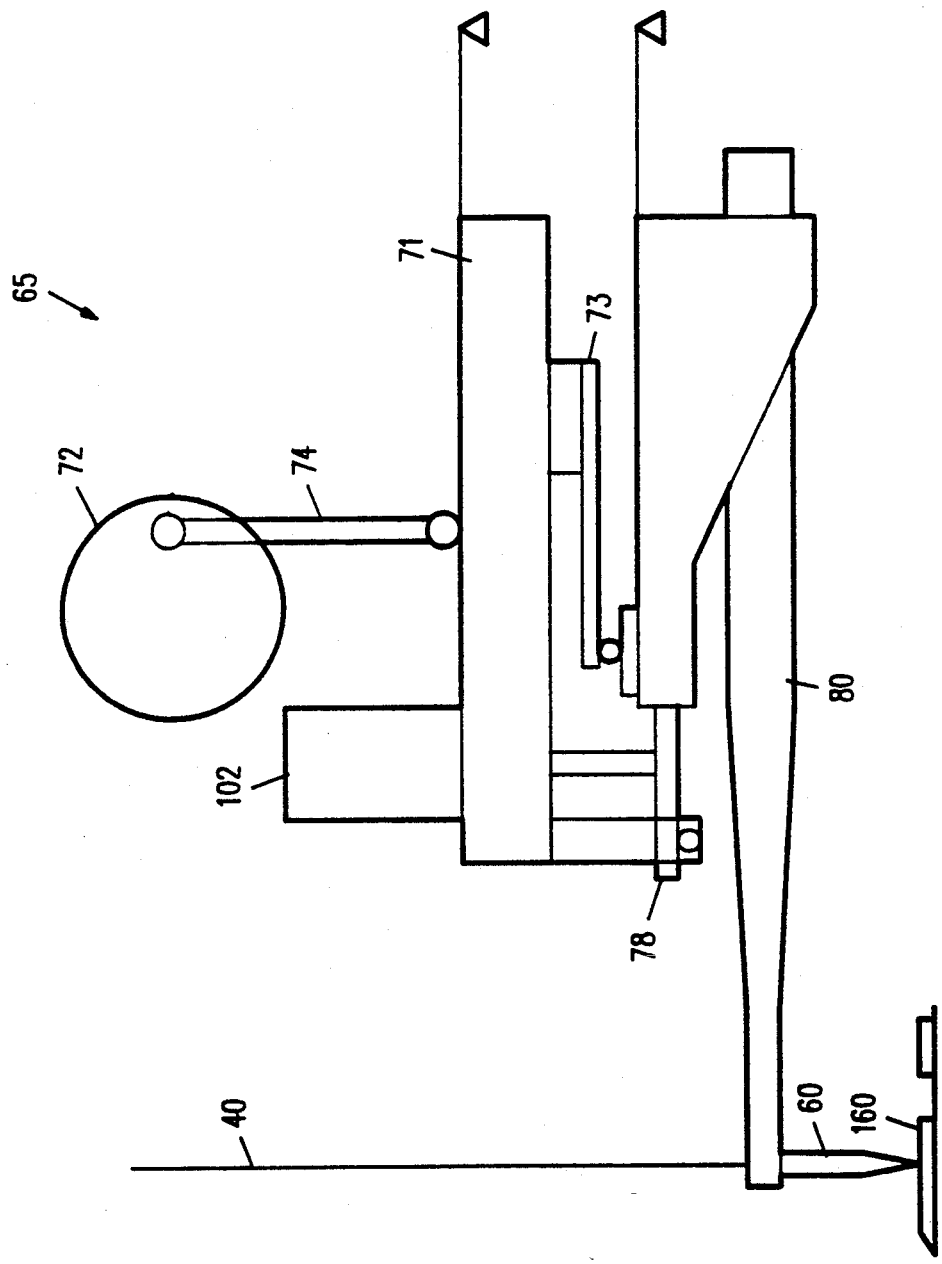
FIG. 3a illustrates one example of a prior art wirebonder.
Figure 3B:
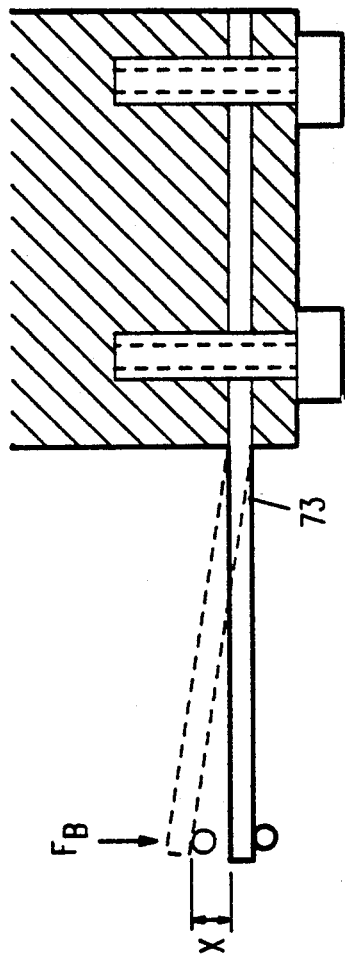
FIG. 3b shows an example of a prior art method of determining the amount of force applied by a wirebonder to bond site.
Figure 3C:
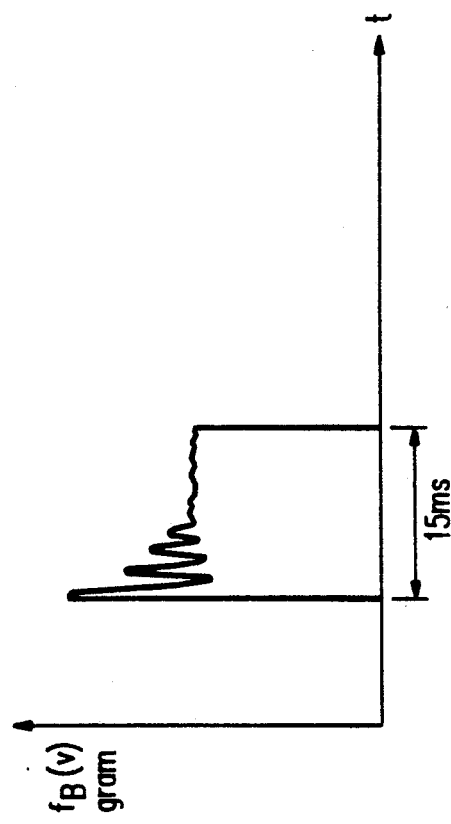
FIG. 3c is a graphical representation of prior art dynamic bond force response of the force applied by a bond tool to a bond site.
Figure 4A:
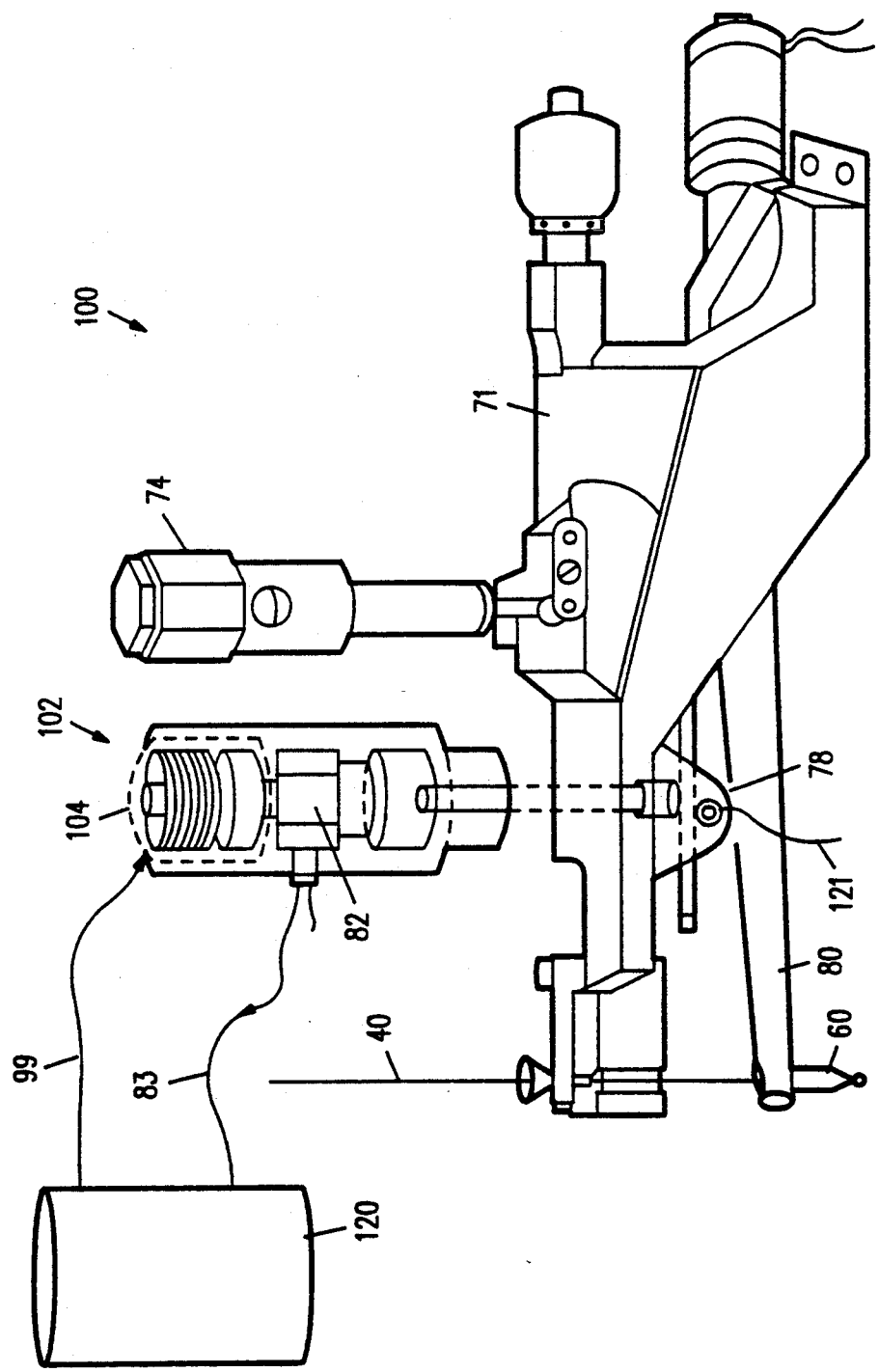
FIG. 4a illustrates one embodiment of a bonder constructed in accordance with the principles of this invention.

FIG. 4a shows an example of a bonder constructed in accordance with the principles of this invention. Bonder 100 comprises capillary 60 coupled to transducer 80 and transducer support frame 71. Transducer 80 and support frame 71 function in a manner similar to that described in the prior art transducer and support frame, described previously with respect to FIGS. 3a and 3b. Connecting rod 74 is coupled to a z motion actuator, such as a z-motor or voice coil, to allow vertical movement of capillary 60 along a z-axis. In one embodiment, the z-motion actuator is driven by a power amplifier, in a well known manner. Damper and force sensor assembly 102 is attached to support frame 71 to provide damping and force sensing. Contact between capillary 60 and bond pad 20 is detected by contact sensor 78, and a resulting contact sensed signal is provided on lead 161 to real-time feedback control circuit 120 (FIG. 4b).

Figure 4B:
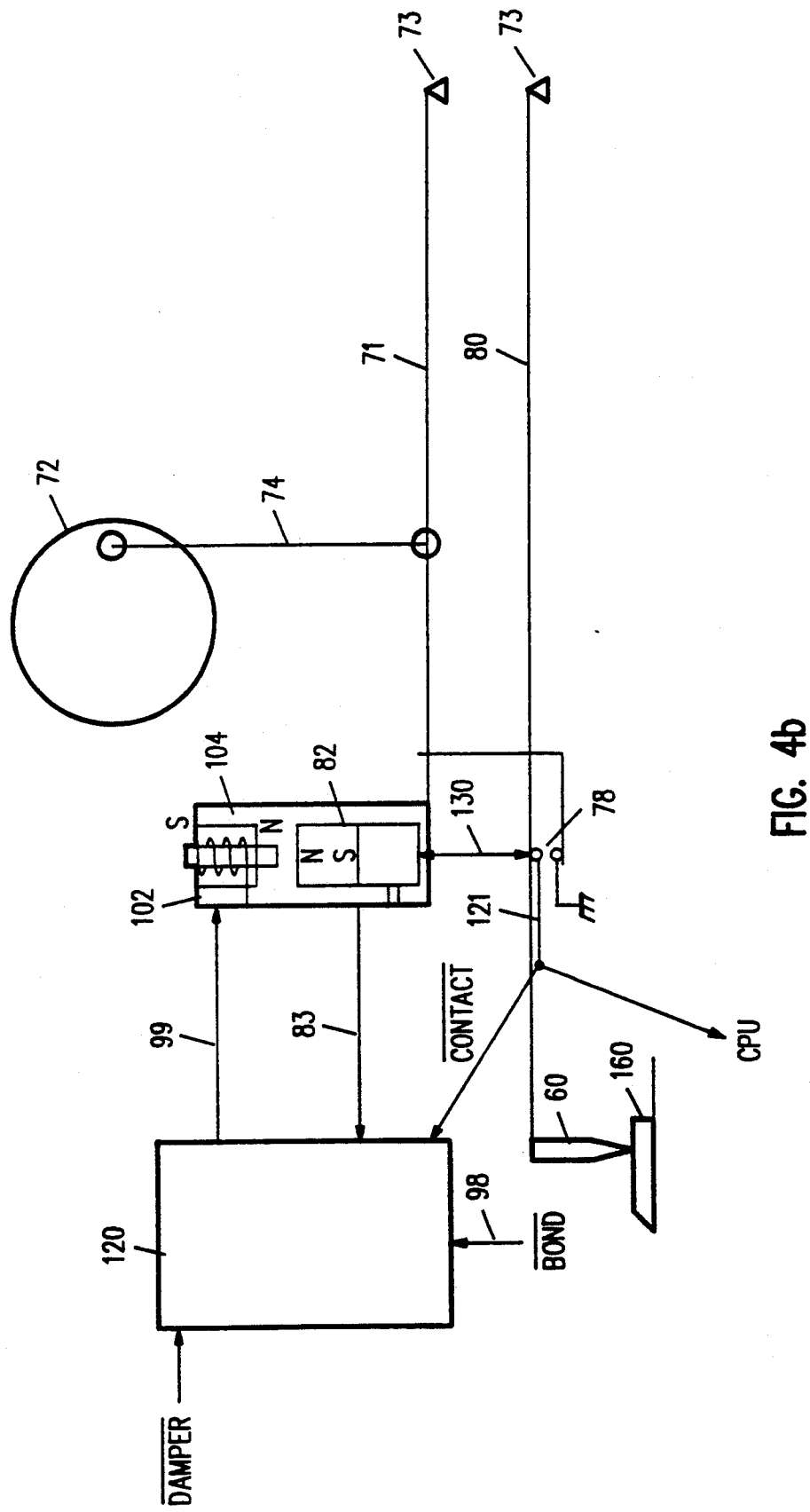

FIG. 4b is a simplified functional block diagram of wirebonder 100. Damper and sensor assembly 102 comprises force sensor 82 and damper solenoid 104, although these need not be formed as a single assembly. Force sensor 82, such as a piezoelectric crystal, is provided to detect the contact force applied to bond site 160 by capillary 60. Force sensor 82 transmits a force sensed signal on signal lead 83 to feedback circuit 120. Feedback circuit 120, in response to the force sensed signal, together with a damper signal and a bond signal received from a CPU (not shown), generates a damper current adjustment signal provided on lead 99 to damper 104 to adjust the force applied by capillary 60 against bond site 160.

In the embodiment of FIGS. 4a and 4b, upon actuation of z motion actuator 72, connecting rod 74 moves support frame 71 toward bond site 160. This motion is coupled via linkage bar 130 to transducer 80, causing capillary 60 toward bonding site 160. When capillary 60 contacts bonding site 160, transducer 80 ceases to make further z movement, causing linear displacement of support frame 71 with respect to transducer 80. This causes contact switch to 121 to open and force sensor 82 to move within assembly 102 toward damper solenoid 104, causing a force to be sensed by force sensor 82. This force signal is applied via lead 78 to feedback control circuit 120. In one embodiment, a permanent magnet is located on force sensor 82 adjust damper solenoid 104 in order to directly assist in controlling bond force oscillations.

Figure 5A:
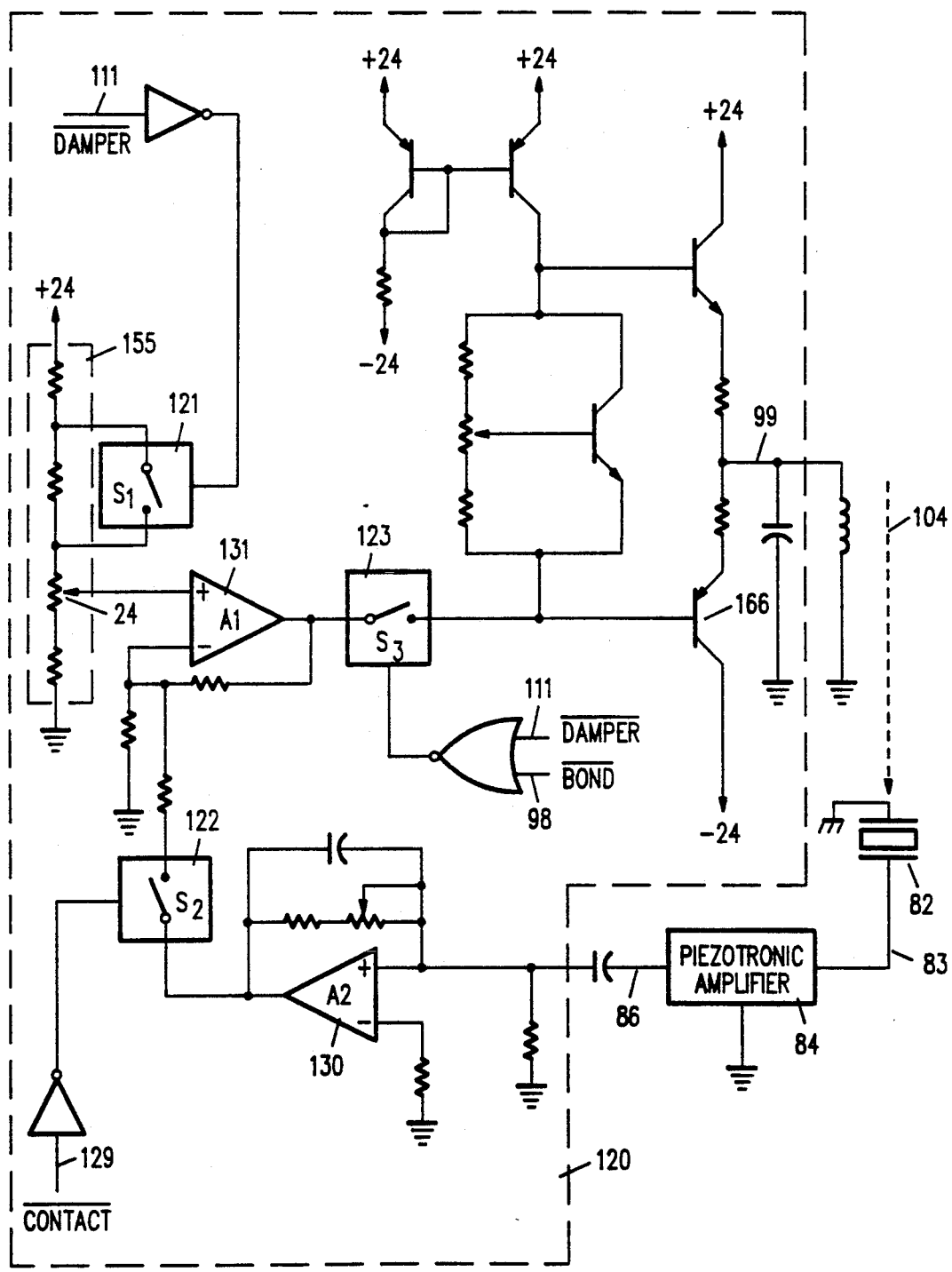
FIG. 5a is a schematic diagram of a real-time feedback bond force sense circuit constructed in accordance with the principles of this invention.

FIG. 5a shows one embodiment of real-time feedback bond force sense circuit 120. Feedback sense circuit 120 is provided to compensate for any resulting underdamping or overdamping due to the force applied by capillary 60 on bond site 160.

Figure 5B:
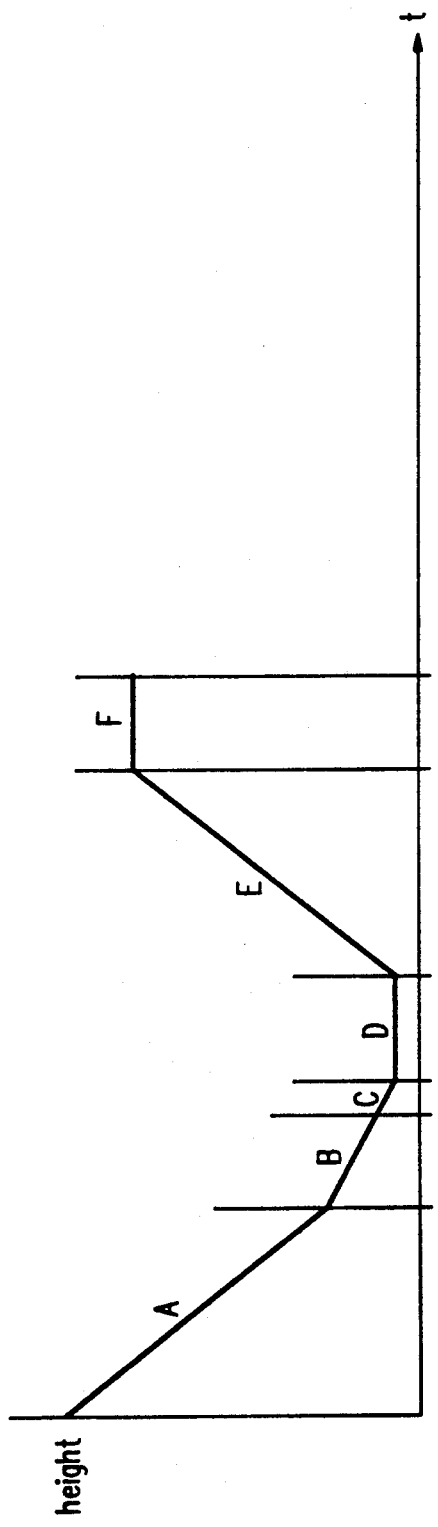
Figure 5C:
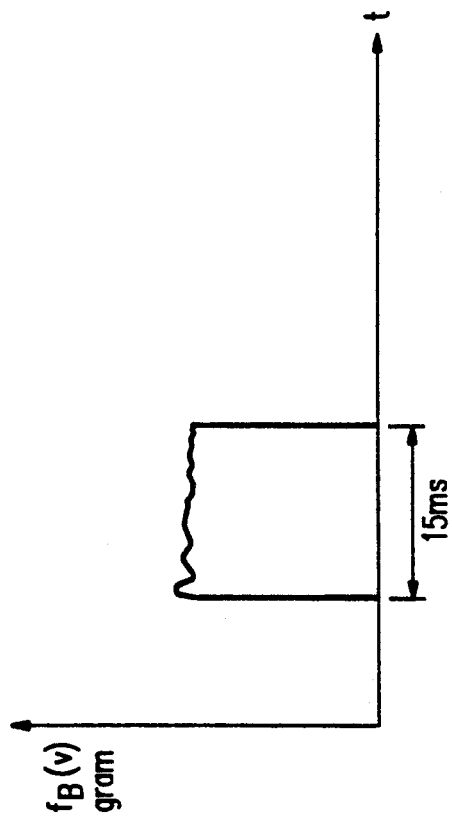
FIG. 5c is a graphical representation of a dynamic bond force response of the force applied to a bond site by a bonder constructed in accordance with the principles of this invention.

FIG. 5b illustrates one example of a corresponding timing diagram of the operation of real-time sense circuit 120 shown in FIG. 5a. The vertical axis represents distance travelled vertically by capillary 60, corresponding to an associated force applied by capillary 60 to bond site 160. Initially, during the period labelled A, the CPU directs connecting rod 74 to lower capillary 60 at a high speed towards bond site 160 until capillary 60 reaches a predetermined distance above bond site 160. Also during period A, damper solenoid 104 is activated and provided with a large current to allow high speed lowering of capillary 60. During the period labelled B, the speed of capillary 60 is reduced to allow a more controlled movement of capillary 60 as capillary 60 nears impact with bond site 160. The beginning of period C defines when contact sensor 78 senses initial impact between capillary 60 and bond site 160. During period C, capillary 60 is furthered lowered thereby applying a predetermined bond force against bond site 160. Period D corresponds to a predefined bond period during which ultrasonic energy is applied during U/S or T/S bonding, and during which the CPU transmits a bond signal to feedback circuit 120 to maintain capillary 60 in place for bond formation between bond wire 40 and bond site 160, thereby neither increasing nor decreasing the vertical distance travelled by capillary 60. Upon concluding period D, period E defines when capillary 60 is raised back to a predefined height corresponding to a height of capillary 60 as at the beginning of period A in preparation for the next bond formation. The steps associated with periods A-E are then repeated for the next bond formation.

It is envisioned as within the scope of the principles taught by this invention to vary the periods according to the user's requirement. For example, the predefined length of periods A-E may be adjusted by the user and stored in the CPU. In yet another embodiment, period F may be included to allow an optional delay period between each bond formation. Also, the periods may be adjusted to take into consideration whether the bond is being made to a bond pad or a lead frame, P.C. board, etc.

Referring again to FIG. 5a, a predefined bond force setting is provided by potentiometer 124 of voltage divider 155, which bond force setting is applied to the non-inverting input lead of differential amplifier 131. As capillary 60 is lowered during period A at a high speed, the $\overline{\text{DAMPER}}$ signal provided on lead 111 from the CPU to feedback circuit 120 is asserted to close switch 121, thereby establishing a higher preset force setting, in order to prevent damping and thus allow transducer 80 and support frame 71 to move in a joined rigid motion. $\overline{\text{DAMPER}}$ goes high after period A reestablishing the preset bond force setting. Upon contact with bond site 160, the force sensed by force sensor 82 is amplified by piezoelectric amplifier 84 and provided as an input signal on lead 86 of differential amplifier 130. With switch 122 closed in response to the assertion of the $\overline{\text{CONTACT}}$ signal provided on lead 129 from contact sensor 78, the output signal of differential amplifier 130 is provided to differential amplifier 131. Switch 123 closes upon the assertion of either $\overline{\text{DAMPER}}$ signal provided on lead 99, or the assertion of $\overline{\text{BOND}}$ signal during period D which is provided on lead 98 from the CPU. With switch 121 opened during period B (FIG. 5b), differential 131 compares the sensed force signal from piezoelectric crystal 82 with a preset bond force value set by potentiometer 124. A sensed force value higher than the preset bond force value causes a decrease in output voltage amplifier 131, allowing greater current through PNP transistor 166, and thus a reduction of the output current provided on signal lead 99 to magnetic coil 104 to thereby reduce the bond force applied by capillary 60.

Figure 6:
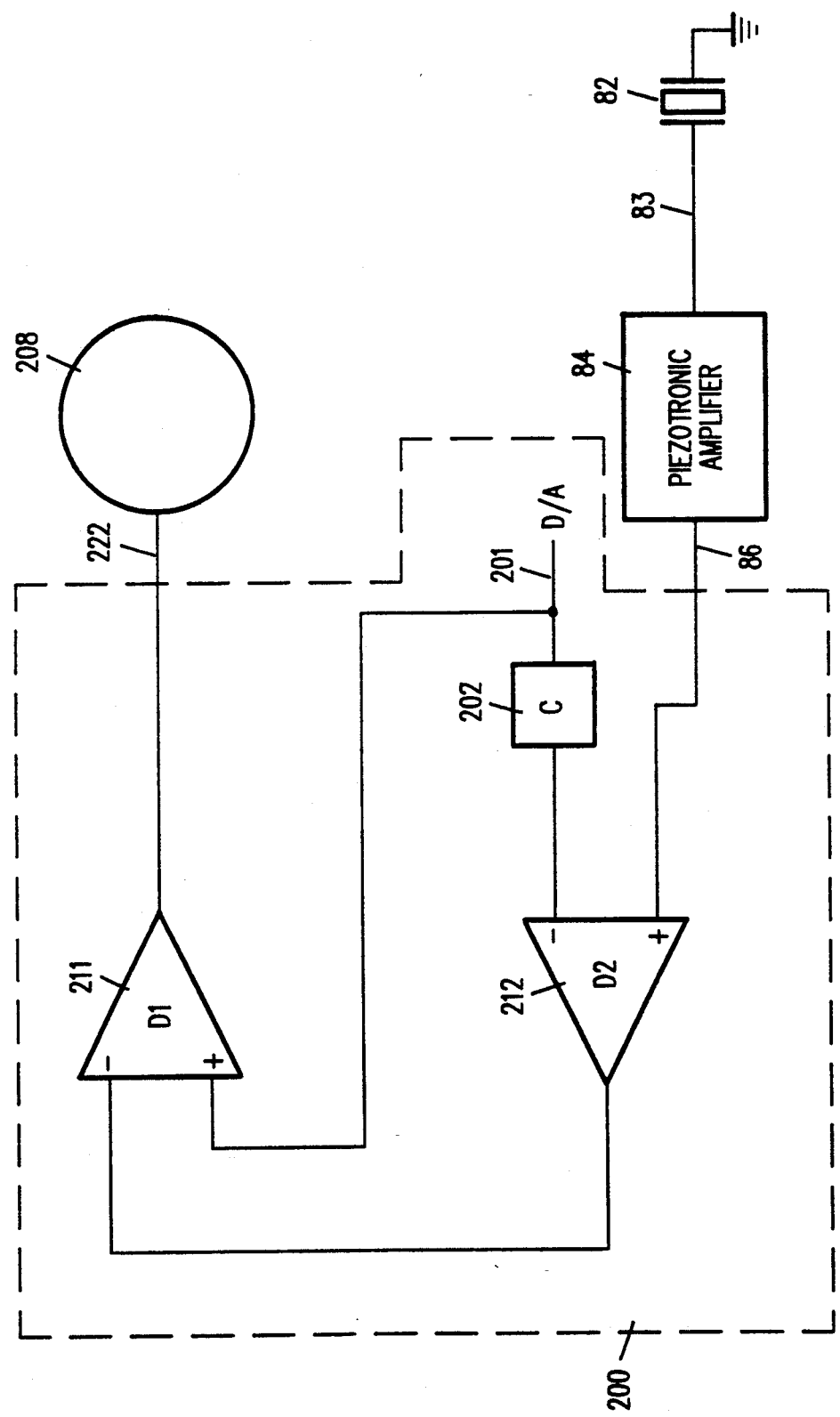
FIG. 6 illustrates an alternative embodiment of a real-time feedback bond force sense circuit constructed in accordance with the principles of this invention.

FIG. 6 illustrates an alternative embodiment of a real-time feedback circuit constructed in accordance with the principles of this invention. With feedback circuit 200, a preset bond force value stored, for example after entry entered by an operator through a system input device, such as a keyboard. The preset bond force value is stored digitally and converted by a digital-to-analog (D/A) converter (not shown) to provide an associated analog signal provided on lead 201 to feedback circuit 200. The force sensed signal from piezoelectric crystal 82 is provided on lead 83 to amplifier 84, which provides an amplified force sensed signal on lead 86 to differential amplifier 212. Differential amplifier 211 compares the amplified force sensed signal from piezoelectric crystal 82 with the analog preset bond force value on lead 201 and provides an output signal on lead 222 which serves as a current adjustment signal to adjust a z-motion actuator 208, such as a voice coil motor. In one embodiment, as shown in FIG. 6, correction circuit 202 provides correction factors attributable to differences between different types of piezoelectric amplifiers or transducers used with feedback circuit 200. In this embodiment, this corrected value from correction circuit 202 is fed to differential amplifier which is coupled between piezoelectric amplifier 84 and differential amplifier 211. In another embodiment, correction factors are calculated and stored in the CPU, and the need for correction circuitry 202 and differential amplifier 212 is avoided.

While the above illustrative examples show the use of this invention with U/S bonders, it is envisioned as within the scope of this invention to use the feedback circuit described with other than U/S bonders, in which case the need for a transducer is avoided.

It is also envisioned as within the scope of this invention to use the feedback circuit described with a variety of interconnect methods, including but not limited to tape automated bonding (TAB), single point TAB, Bonded Interconnect Pin (BIP), and solder bumping as applied by a wirebonder for flip chip applications. These techniques provide methods of forming an electrical or thermal interconnect element between active or passive circuits such as a laminated, thick film or thin film substrate or board and would therefore benefit from accurate real-time feedback detection as provided by the feedback circuit described in accordance with the teachings of this invention.

All publications and patent applications mentioned in this specification are herein incorporated by reference to the same extent as if each individual publication or patent application was specifically and individually indicated to be incorporated by reference.

The invention now being fully described, it will be apparent to one of ordinary skill in the art that many changes and modifications can be made thereto without departing from the spirit or scope of the appended claims.

What is claimed is:

1. An interconnect bonding system for forming an electrically conductive bond to a bond site, comprising:
    a z-motion actuator;
    a support frame coupled to said direct drive device to provide a motion of said support frame along a z-axis;
    a bond tool coupled to said support frame;
    an electrically controlled damper mounted between said support frame and said bond tool;
    a force sensor coupled to said support frame to detect a bond tool force and provide a force signal; and
    a feedback circuit coupled to receive said force signal and provide in response thereto an adjustment signal to said damper.

2. A bonding system of claim 1 wherein said drive device comprises:
    a bond head motor;
    a crank connected to said bond head motor;
    a connecting rod connected between said crank and said bond tool; and
    a bond head motor power amplifier coupled to said bond head motor and also coupled to said feedback circuit to receive said adjustment signal, wherein in response to said adjustment signal, said bond head motor power amplifier causes said bond head motor to either increase or decrease movement of said bond tool.

3. A bonding system of claim 1 wherein said z-motion actuator comprises:
    a voice coil; and
    a voice coil power amplifier coupled to said voice coil and also coupled to said feedback circuit to receive said adjustment signal,
    wherein in response to said adjustment signal, said voice coil amplifier causes said voice coil to either increase or decrease movement of said bond tool.

4. A bonding system as in claim 1, which further comprises a transducer coupled between said support frame and said bond tool.

5. A method for forming an electrically conductive bond to a bond site utilizing an interconnect bonding system comprising a z-motion actuator, a support frame coupled to said direct drive device to provide a motion of said support frame along a z-axis, a bond tool coupled to said support frame, an electrically controlled damper mounted between said support frame and said bond tools, and a force sensor coupled to said support frame to detect a bond tool force and provide a force signal, comprising the steps of:
    moving said bond tool to form a bond;
    monitoring said force signal; and
    providing in response to said force signal an adjustment signal to said damper.

6. A method as in claim 5 wherein said drive device comprises a bond head motor, a crank connected to said bond head motor, a connecting rod connected between said crank and said bond tool, and a bond head motor power amplifier coupled to said bond head motor, wherein said method further comprises the step of also providing said adjustment signal to said bond head motor power amplifier in order to cause said bond head motor to either increase or decrease movement of said bond tool in response to said force signal.

7. A bonding system of claim 5 wherein said z-motion actuator comprise a voice coil and a voice coil power amplifier coupled to said voice coil, wherein said method further comprises the step of providing said adjustment signal to said voice coil power amplifier in order to cause said voice coil to either increase or decrease movement of said bond tool in response to said force signal.

* * * * *